(12) United States Patent
Lin

(10) Patent No.: US 9,226,415 B1
(45) Date of Patent: Dec. 29, 2015

(54) SERVER CASING

(71) Applicants: INVENTEC (PUDONG) TECHNOLOGY CORPORATION, Shanghai (CN); INVENTEC CORPORATION, Taipei (TW)

(72) Inventor: Yu-Huan Lin, Taipei (TW)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 14/687,009

(22) Filed: Apr. 15, 2015

(30) Foreign Application Priority Data

Nov. 27, 2014 (CN) .......................... 2014 1 0707205

(51) Int. Cl.
| | | |
|---|---|---|
| H05K 5/00 | (2006.01) | |
| H05K 5/02 | (2006.01) | |
| H05K 5/03 | (2006.01) | |

(52) U.S. Cl.
CPC ................ *H05K 5/02* (2013.01); *H05K 5/0217* (2013.01); *H05K 5/0239* (2013.01); *H05K 5/03* (2013.01)

(58) Field of Classification Search
CPC ......... H05K 5/02; H05K 5/03; H05K 5/0204; H05K 5/0217; H05K 5/0239
See application file for complete search history.

(56) References Cited

U.S. PATENT DOCUMENTS

| | | | | |
|---|---|---|---|---|
| 6,246,580 | B1 * | 6/2001 | Weng ........................ | G06F 1/18 174/16.1 |
| 6,711,859 | B2 * | 3/2004 | Bell ........................ | B65D 11/00 220/4.02 |
| 2006/0103272 | A1 * | 5/2006 | Chen .................... | E05B 65/006 312/223.2 |
| 2006/0291155 | A1 * | 12/2006 | Chen ....................... | G06F 1/181 361/679.02 |
| 2013/0169128 | A1 * | 7/2013 | Chen ....................... | G06F 1/181 312/223.2 |
| 2013/0314856 | A1 * | 11/2013 | Mao ........................ | H05K 5/03 361/679.01 |
| 2014/0251678 | A1 * | 9/2014 | Chen .................... | H05K 5/0221 174/520 |
| 2014/0307386 | A1 * | 10/2014 | French, Jr. ................ | G06F 1/16 361/679.58 |
| 2015/0201522 | A1 * | 7/2015 | Jau ....................... | G11B 33/128 312/330.1 |

* cited by examiner

*Primary Examiner* — Daniel Rohrhoff
(74) *Attorney, Agent, or Firm* — Huffman Law Group, PC

(57) ABSTRACT

A server casing includes a shell, a top cover, two first slide rails and two second slide rails. The shell includes two side frames. The two side frames are connected to the two sides of the shell. The top cover is movably disposed on the shell and includes an upper part. The two side parts are connected to the two sides of the upper part. Each first slide rail includes a first body part and a first extension part. The two first body parts are fixed to the two side frames of the shell. Each second slide rail includes a second body part and a second extension part. The two second body parts are fixed to the two side parts of the top cover. Each first extension part of each first slide rail are corresponding to and assembled with each second extension parts of each second slide rail.

12 Claims, 4 Drawing Sheets

SERVER CASING

CROSS-REFERENCE TO RELATED APPLICATIONS

This non-provisional application claims priority under 35 U.S.C. §119(a) on Patent Application No(s). 201410707205.3 filed in China on Nov. 27, 2014, the entire contents of which are hereby incorporated by reference.

BACKGROUND OF THE INVENTION

1. Technical Field of the Invention

The disclosure relates to a server casing. More particularly, the disclosure relates to a server casing with a slidable top cover.

2. Description of the Related Art

With the development of technology, the internet is widely used in daily life for getting access to information from other individuals and organizations. Accordingly, the demand for the hardware (such as a server) has increased, so a user can use the advanced servers to save more information or data.

In prior art, the server comprises a shell and a top cover. The shell comprises a rail part for matching with a sliding part of the top cover. Thus, the top cover can slide relative to the shell. However, the shell and the top cover are made of metal, such that a frictional force generated between the shell and the top is increased. Accordingly, the top cover cannot smoothly slide relative to the shell.

Additionally, the rail part of the shell and the sliding part of the top cover are manufactured by different manufacturing processes, such that the cost of the rail part and the sliding part and tolerance between the rail part and the sliding part cannot be reduced, and the manufacturing efficiency of the shell and the top cover cannot be improved either. Furthermore, since the rail part and the sliding part are manufactured by the different manufacturing processes, manufacturers need to prepare and store a lot of spare rail parts and spare sliding parts, for replacing the rail part and the sliding part when they are damaged. Thus, maintenance costs are increased accordingly.

SUMMARY OF THE INVENTION

One aspect of the disclosure provides a server casing which comprises a shell, a top cover, two first slide rails and two second slide rails. The shell comprises a tray with two sides which are opposite to each other and two side frames. The two side frames are connected to the two sides of the shell, respectively. The top cover is movably disposed on the shell and slidable along the two side frames. The top cover comprises an upper part with two sides which are opposite to each other and two side parts. The two side parts are connected to the two sides of the upper part, respectively. The two first slide rails are made of plastic. Each first slide rail comprises a first body part and a first extension part which are connected to each other. The two first body parts are fixed to the two side frames of the shell, respectively. The two second slide rails are made of plastic. Each second slide rail comprises a second body part and a second extension part which are connected to each other. The two second body parts are fixed to the two side parts of the top cover respectively. Each first extension part of each first slide rail is corresponding to and located between one of the second extension parts of the second slide rail and one of the side parts of the top cover, respectively. Each second extension part of each seconds slide rail is corresponding to and located between one of the first extension parts of the first slide rail and one of the side frames of the shell.

Another aspect of the disclosure provides a server casing which comprises a shell, a top cover, two first slide rails and two second slide rails. The shell comprises a tray with two sides which are opposite to each other and two side frames. The two side frames are connected to the two sides of the shell, respectively. The top cover is movably disposed on the shell and slidable along the two side frames. The top cover comprises an upper part with two sides which are opposite to each other and two side parts. The two side parts are connected to the two sides of the upper part, respectively. Each first slide rail comprises a first body part and a first extension part which are connected to each other. The two first body parts are fixed to the two side frames of the shell, respectively. Each second slide rail comprises a second body part and a second extension part which are connected to each other. The two second body parts are fixed to the two side parts of the top cover respectively. Each first extension part of each first slide rail is corresponding to and located between each second extension part of each second slide rail and each side part of the top cover. Each second extension part of each second slide rail is corresponding to and located between each first extension part of each first slide rail and each side frame of the shell. Additionally, structures of the two first slide rails and structures of the two second slide rails are substantially the same.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
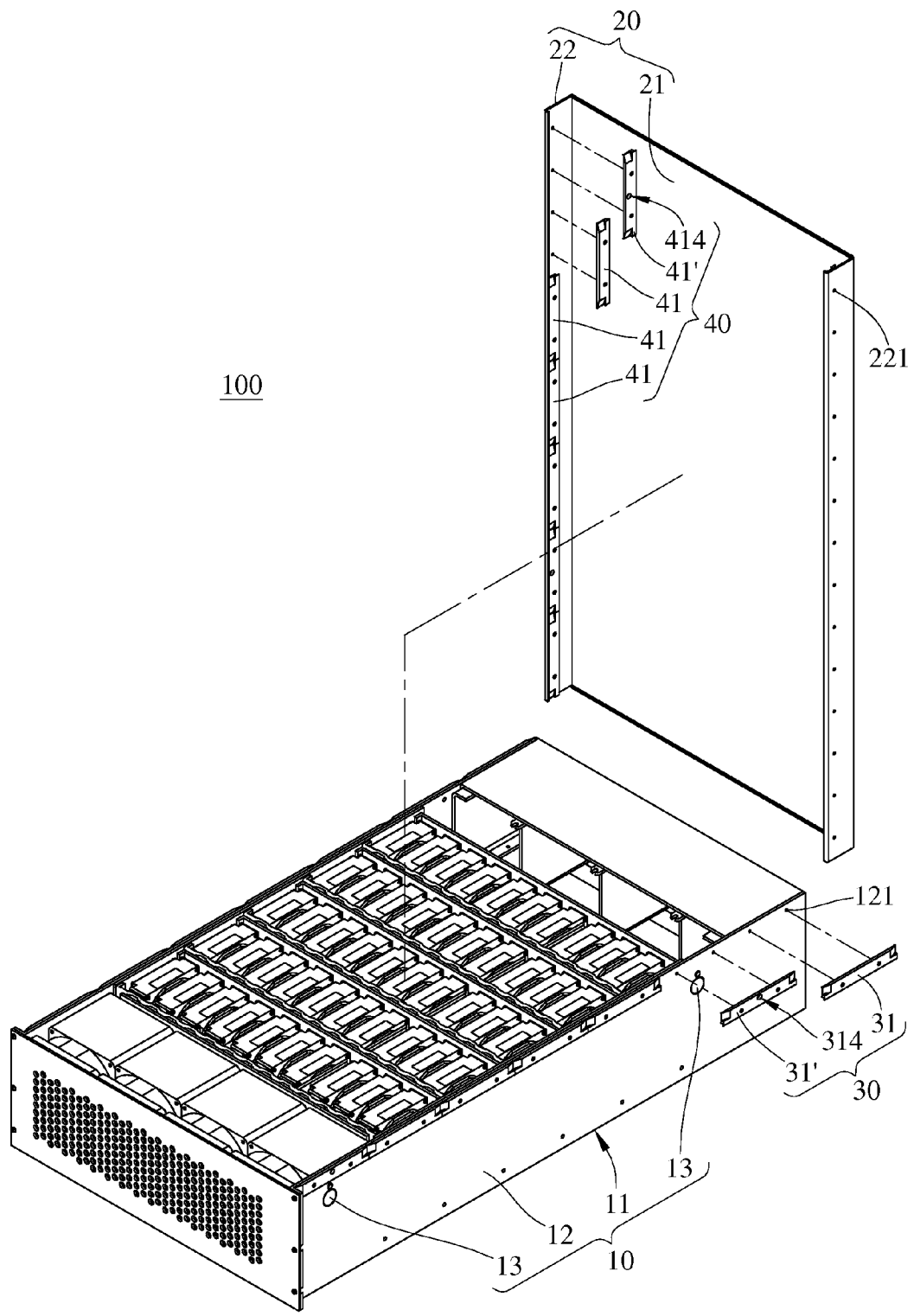
FIG. 1 is an exploded view of a server casing according to an embodiment of the disclosure.
Figure 2A:
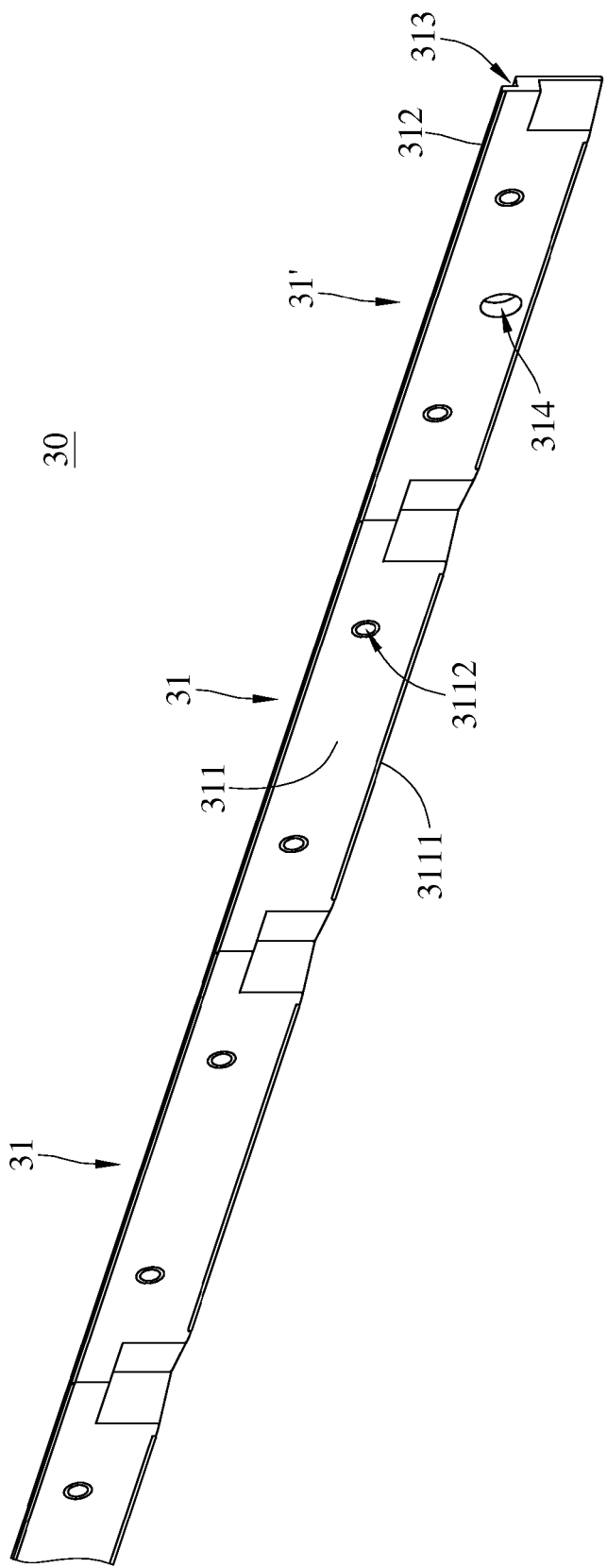
FIG. 2A is a perspective view of a first slide rail of the server casing according to the embodiment of the disclosure.
Figure 2B:
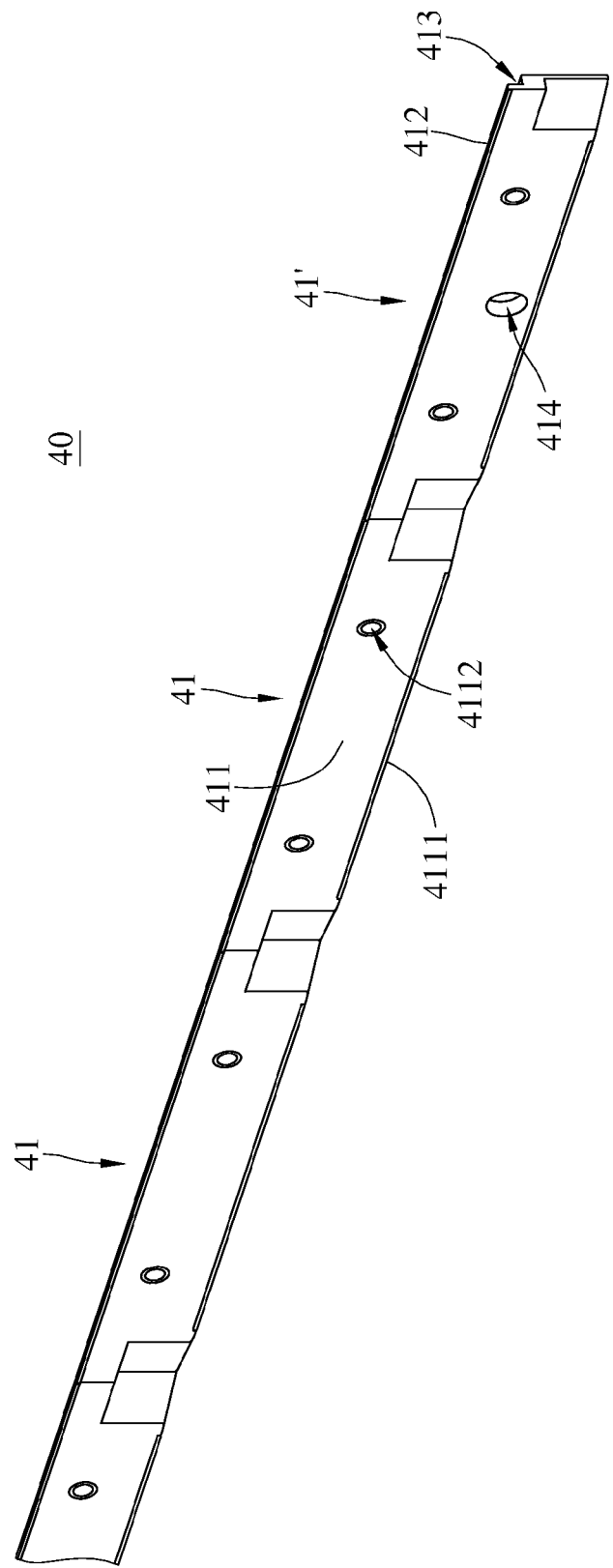
FIG. 2B is a perspective view of a second slide rail of the server casing according to the embodiment of the disclosure.
Figure 3:
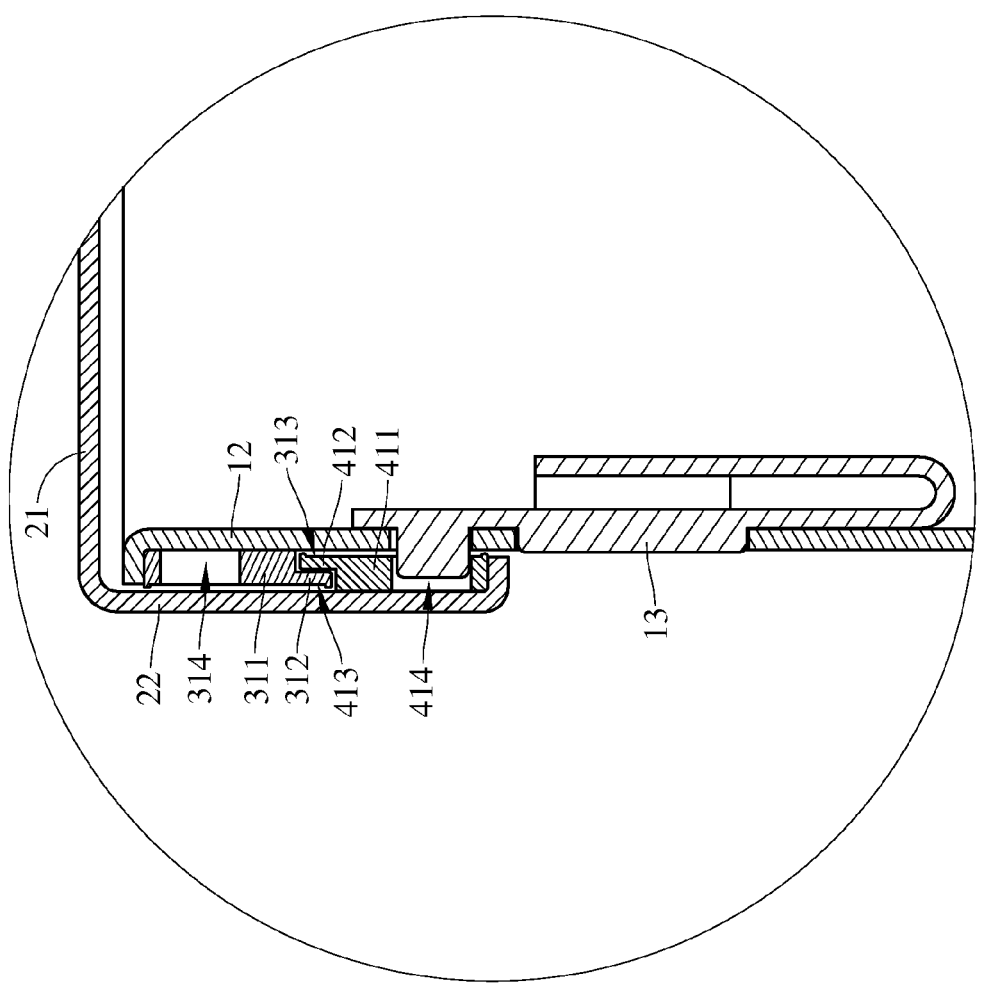
FIG. 3 is a cross-sectional view of the server casing according to the embodiment of the disclosure.

Please refer to FIG. 1 through FIG. 3. FIG. 1 is an exploded view of a server casing according to an embodiment of the disclosure. FIG. 2A is a perspective view of a first slide rail of the server casing according to the embodiment of the disclosure. FIG. 2B is a perspective view of a second slide rail of the server casing according to the embodiment of the disclosure. FIG. 3 is a cross-sectional view of the server casing according to the embodiment of the disclosure. As shown in FIGS., the server casing 100 comprises a shell 10, a top cover 20, two first slide rails 30 and two second slide rails 40.

The shell 10 comprises a tray 11, two side frames 12 and a plurality of mounting components 13. The tray 11 has two sides which are opposite to each other, and the two side frames 12 are connected to and stand on the two sides of the tray 11, respectively. Each side frame 12 comprises a plurality of first fixing structures 121, such as a plurality of bumps. The mounting components 13 are fixed to the two side frames 12, respectively. Moreover, a part of each mounting component 13 protrudes outward from a surface of each side frame 12.

The top cover 20 is movably disposed on the shell 10 and movable relative to the two side frames 12. The top cover 20 comprises an upper part 21 and two side parts 22. The upper part 21 has two sides, and the two side parts 22 are connected to the two sides of the upper part 21, respectively. Each side part 22 comprises a plurality of second fixing structures 221, such as a plurality of bumps.

Each first slide rail 30 comprises a plurality of first rail components 31 and a plurality of first rail components 31' which are made of plastic. Each of the first rail components 31 and the first rail components 31' comprises a first body part 311 and a first extension part 312. The first body part 311 has two first long edges 3111. The first body part 311 and the first extension part 312 are integrally formed into a single unit. The first extension part 312 is connected to one of the two first long edges 3111 of the first body part 311. A thickness of the first body part 311 is greater than a thickness of the first extension part 312. Additionally, the first body part 311 further has at least one first fixing hole 3112. The first fixing structures 121 of the two side frames 12 are sequentially fixed to the first fixing holes 3112 of the first rail components 31 and the first rail components 31', respectively. Thus, the first rail components 31 and the first rail components 31' are sequentially arranged with the two side frames 12. The first body part 311, the first extension part 312 and the side frame 12 together form a first slide space 313 due to a difference between the thickness of the first body part 311 and the thickness of the first extension part 312. Moreover, compared with the first rail component 31, the first rail component 31' further has a first mounting hole 314.

Each second slide rail 40 comprises a plurality of second rail components 41 and a plurality of second rail components 41'. The plurality of second rail components 41 and the plurality of second rail components 41' are made of plastic. Each of the second rail components 41 and the second rail components 41' comprises a second body part 411 and a second extension part 412. The second body part 411 has two second long edges 4111. The second body part 411 and the second extension part 412 are integrally formed into a single unit. The second extension part 412 is connected to one of the two second long edges 4111 of the second body part 411. A thickness of the second body part 411 is greater than a thickness of the second extension part 412. Additionally, the second body part 411 further has at least one second fixing hole 4112. The second fixing structures 221 of the two side parts 22 are sequentially fixed to the second fixing hole 4112 of the second rail components 41 and 41', respectively. The second body part 411, the second extension part 412 and the side part 22 together form a second slide space 413 due to a difference between the thickness of the second body part 411 and the thickness of the second extension part 412. Moreover, compared with the second rail component 41, the second rail component 41' further has a second mounting hole 414 matched with the mounting component 13, such that the top cover 20 can be assembled with the shell 10.

Furthermore, the structures of the first slide rails 30 and the second slide rails 40 are substantially the same. Specifically, the structures of the first rail components 31 of the first slide rails 30 and the second rail components 41 of second slide rails 40 are substantially the same, and the structures of the first rail components 31' of the first slide rails 30 and the second rail components 41' of second slide rails 40 are also substantially the same. Accordingly, the first rail components 31 and the second rail components 41 can be replaced by each other, and the first rail components 31' and the second rail components 41' also can be replaced by each other. Moreover, the difference between the first rail components 31 and the first rail components 31' is that the first rail component 31' has the first mounting hole 314. Thus, the first rail component 31 and a prototype of the first rail component 31' can be manufactured first by the same mold by performing an injection moulding process first, and then the first rail component 31' is processed and manufactured by a subsequent process. Similar to the first rail component 31 and the first rail component 31', the second rail component 41 and a prototype of the second rail component 41' also can be manufactured first by the same mold by performing an injection moulding process, and then the second rail component 41' can also be processed and manufactured by performing the same process.

When the top cover 20 is disposed on and totally covers the shell 10, the first extension parts 312 of the first rail components 31 and the first rail components 31' are located inside the second slide space 413 which is formed by the side part 22, the second body parts 411 and the second extension parts 412 of the second rail components 41 and the second rail components 41', correspondingly. Namely, the first extension parts 312 of the first rail components 31 and the first rail components 31' are located between the side part 22 and the second extension parts 412 of the second rail components 41 and 41', correspondingly. Similarly, the second extension parts 412 of the second rail components 41 are located inside the first slide space 313 which is formed by the side frame 12, the first body part 311 and the first extension part 312 of the first rail component 31, correspondingly. Namely, the second extension parts 412 of the second rail components 41 are located between the side frame 12 and the first extension parts 312 of the first rail components 31, correspondingly. The first rail components 31 of the first slide rail 30 is slidably assembled with the second rail components 41 of the second slide rail 40, such that the top cover 20 can slide relative to the side frame 12. Additionally, the second mounting hole 414 of the second rail components 41' is assembled with the mounting component 13, such that the top cover 20 can be assembled with the shell 10.

For assembling the top cover 20 with the shell 10, in this embodiment, the second slide rail 40 comprises both the second rail component 41' with the second mounting hole 414 and the second rail component 41 without the second mounting hole 414. However, in other embodiments, the second slide rail 40 comprises the plurality of second rail component 41' all with the second mounting hole 414 for assembling the top cover 20 with the shell 10, and the second slide rail 40 does not comprise the second rail component 41. Additionally, in other embodiments, when the second slide rail 40 comprises the plurality of second rail component 41 and does not comprise the second rail component 41', the top cover 20 is fixed to the shell 10 by other assembly components. In terms of the first slide rails 30, since the first slide rail 30 does not match with the mounting component 13 in this embodiment, the configuration of the first slide rail 30 can be varied without taking the mounting components 13 into consideration. For example, in some embodiments, the first slide rail 30 comprises the first rail component 31' with the first mounting hole 314 and does not comprise the first rail component 31. In some other embodiments, the first slide rail 30 comprises the first rail component 31 without the first mounting hole 314 and does not comprise the first rail component 31'.

To sum up, since the first slide rail and the second slide rail of the server casing are substantially the same, the first slide rail and the second slide rail can be manufactured by the same manufacturing process, such that the costs and tolerance between the first slide rail and the second slide rail can be reduced, and the manufacturing efficiency of the shell and the top cover can be improved. Moreover, manufacturers do not need to prepare and store spare slide rails for replacing the first slide rail and the second slide rail when they are damaged. Furthermore, both the first slide rail and the second slide rail are made of plastic, such that a frictional force between the first slide rail and the second slide rail can be decreased. Accordingly, the top cover can slide relative to the shell smoothly.

The disclosure will become more fully understood from the said embodiment for illustration only and thus does not limit the disclosure. Any modifications within the spirit and category of the disclosure fall in the scope of the disclosure.

What is claimed is:

1. A server casing, comprising:
    a shell comprising a tray with two sides which are opposite to each other and two side frames, and the two side frames being connected to the two sides of the shell, respectively;
    a top cover movably disposed on the shell and slidable along the two side frames, the top cover comprising an upper part with two sides which are opposite to each other and two side parts, and the two side parts being connected to the two sides of the upper part, respectively;
    two first slide rails made of plastic, each first slide rail comprising a first body part and a first extension part which are connected to each other, and the two first body parts being fixed to the two side frames of the shell, respectively; and
    two second slide rails made of plastic, each second slide rail comprising a second body part and a second extension part which are connected to each other, and the two second body parts being fixed to the two side parts of the top cover, respectively, each first extension part of each first slide rail corresponding to and located between one of the second extension parts of the second slide rail and one of the side parts of the top cover, respectively, and each second extension part of each second slide rail corresponding to and located between one of the first extension parts of the first slide rail and one of the side frames of the shell.

2. The server casing according to claim 1, wherein each first slide rail comprises a plurality of first rail components, each of the second slide rails is a combination of a plurality of second rail components, and a structure of each first rail component and a structure of each second rail component are substantially the same.

3. The server casing according to claim 2, wherein one of the plurality of first rail components has a mounting hole.

4. The server casing according to claim 2, wherein one of the plurality of second rail components has a mounting hole.

5. The server casing according to claim 1, wherein the first body part and the first extension part of each first slide rail are integrally formed into a single unit.

6. The server casing according to claim 1, wherein the second body part and the second extension part of each second slide rail are integrally formed into a single unit.

7. A server casing, comprising:
    a shell comprising a tray with two sides which are opposite to each other and two side frames, and the two side frames being connected to the two sides of the shell, respectively;
    a top cover movably disposed on the shell and slidable along the two side frames, the top cover comprising an upper part with two sides which are opposite to each other and two side parts, and the two side parts being connected to the two sides of the upper part, respectively;
    two first slide rails, each first slide rail comprising a first body part and a first extension part which are connected to each other, and the two first body parts being fixed to the two side frames of the shell, respectively; and
    two second slide rails, each second slide rail comprising a second body part and a second extension part which are connected to each other, and the two second body parts being fixed to the two side parts of the top cover respectively, each first extension part of each first slide rail corresponding to and located between each second extension part of each second slide rail and each side part of the top cover, and each second extension part of each second slide rail being corresponding to and located between each first extension part of each first slide rail and each side frame of the shell;
    wherein, structures of the two first slide rails and structures of the two second slide rails are substantially the same.

8. The server casing according to claim 7, wherein each first slide rail comprises a plurality of first rail components, and each second slide rail comprises a plurality of second rail components.

9. The server casing according to claim 8, wherein one of the plurality of first rail components has a mounting hole.

10. The server casing according to claim 8, wherein one of the plurality of second rail components has a mounting hole.

11. The server casing according to claim 7, wherein the first body part and the first extension part of each first slide rail are integrally formed into a single unit, and the first body part and the first extension part of each first slide rail are made of plastic.

12. The server casing according to claim 7, wherein the second body part and the second extension part of each second slide rail are integrally formed into a single unit, and the second body part and the second extension of each second slide rail are made of plastic.

* * * * *